(12) United States Patent
Borthwick

(10) Patent No.: US 11,054,444 B2
(45) Date of Patent: Jul. 6, 2021

(54) SYSTEM AND METHOD FOR LIMITING VOLTAGE

(71) Applicant: Qualitau, Inc., Mountain View, CA (US)

(72) Inventor: James Borthwick, Santa Clara, CA (US)

(73) Assignee: QualiTau, Inc., Santa Clara, CA (US)

( * ) Notice: Subject to any disclaimer, the term of this patent is extended or adjusted under 35 U.S.C. 154(b) by 856 days.

(21) Appl. No.: 15/846,543

(22) Filed: Dec. 19, 2017

(65) Prior Publication Data

US 2018/0172734 A1  Jun. 21, 2018

Related U.S. Application Data

(60) Provisional application No. 62/437,366, filed on Dec. 21, 2016.

(51) Int. Cl.
*G01R 1/36* (2006.01)
*H02H 1/00* (2006.01)
*H02H 9/04* (2006.01)
*G01R 31/319* (2006.01)

(52) U.S. Cl.
CPC .............. *G01R 1/36* (2013.01); *H02H 1/0007* (2013.01); *H02H 9/04* (2013.01); *G01R 31/31924* (2013.01)

(58) Field of Classification Search
CPC .......... G01R 1/203; G01R 1/36; G01R 15/08; G01R 19/0053; G01R 31/2839; G01R 31/2841; G01R 31/3004; G01R 31/3163; G01R 31/31721; G01R 31/31924; G01R 31/31926; H02H 1/0007; H02H 9/04
See application file for complete search history.

(56) References Cited

U.S. PATENT DOCUMENTS 5,731,695 A * 3/1998 Shioda ..................... H03G 7/08
323/299
5,773,990 A * 6/1998 Wilstrup ............ G01R 31/3004
324/762.02

(Continued)

OTHER PUBLICATIONS (Per Pin Parametric Measurement Unit/Source Measure Unit: Analog Devices [online], analog.com [retrieved on Sep. 15, 2005], Retrieved from the Internet: <URL: https://www.analog.com/media/en/technical-documentation/data-sheets/AD5520.pdf> (Year: 2005).*

*Primary Examiner* — Jared Fureman
*Assistant Examiner* — Nicolas Bellido
(74) *Attorney, Agent, or Firm* — Beyer Law Group LLP

(57) ABSTRACT

A voltage limiting circuit for limiting the voltage developed across a current sensing circuit and a method are disclosed. The voltage limiting circuit includes an input terminal configured to receive an input signal from the current sensing circuit, and an output terminal configured to receive an output signal from the current sensing circuit. A voltage sense circuit is connected to the input terminal and output terminal to detect that a predefined threshold voltage is developed between the input terminal and output terminal. An activation circuit receives a signal from the voltage sense circuit to activate the voltage limiting circuit, and a level shifting circuit interfaces the voltage sense circuitry to the activation circuitry and other circuits by level shifting signals to required levels.

17 Claims, 3 Drawing Sheets

(56) References Cited

U.S. PATENT DOCUMENTS

| | | | |
|---|---|---|---|
| 7,151,389 B2* | 12/2006 | Raichman | G01R 31/31926 324/762.01 |
| 7,369,385 B2* | 5/2008 | Brennan | H02H 9/02 361/93.1 |
| 9,453,880 B2* | 9/2016 | Goeke | G01R 31/31721 |
| 10,254,376 B2* | 4/2019 | Wilson | G01R 35/005 |
| 2006/0192571 A1* | 8/2006 | Banaska | G01R 31/2839 324/713 |
| 2009/0121908 A1* | 5/2009 | Regier | G01R 31/31924 341/142 |

* cited by examiner

SYSTEM AND METHOD FOR LIMITING VOLTAGE

RELATED APPLICATIONS

This application claims the benefit of U.S. Provisional Patent Application No. 62/437,366, filed Dec. 21, 2016, entitled "CURRENT SENSE OVERLOAD LIMITING CIRCUIT." The foregoing provisional application is hereby incorporated herein by reference in its entirety for all purposes.

FIELD OF INVENTION

The present invention relates generally to electrical measurement equipment, and, in particular, to Source Measurement Units (SMUs) for use in measuring electrical current.

BACKGROUND

Semiconductor testing and characterization typically requires measuring device currents over a wide range (e.g., pA to mA current levels). A single step in voltage during a device parametric sweep may result in a change in current of several decades due to the logarithmic IV characteristics of the device. This may cause a situation in which an SMU's current sense resistors develop too much burden voltage and overload the sourcing hardware. For example, at one step in a sweep, a device's current measures 1 nA and a 1 Gohm resistor is used to measure the current, and at the next step in the sweep the device current increases to 100 nA, causing the burden voltage to increase from 1V to 100V, which is not practical for a typical SMU to handle. Instead, the output of the SMU will be overloaded, and the target output voltage will not be achieved.

SUMMARY

In accordance with an embodiment, a voltage limiting circuit for limiting the voltage developed across a current sensing circuit and a method are disclosed. The voltage limiting circuit includes input and output terminals connected to the current sensing circuit. The voltage limiting circuit also includes a voltage sense circuit, connected to the input terminal and output terminal, configured to detect that a predefined threshold voltage is developed between the input terminal and output terminal. The voltage limiting circuit further includes an activation circuit configured to activate the voltage limiting circuit in accordance with a signal being received from the voltage sense circuit. The voltage limiting circuit also includes a level shifting circuit configured to level shift signals, interfacing the voltage sense circuitry to the activation circuitry and other circuits.

DETAILED DESCRIPTION

Figure 1:
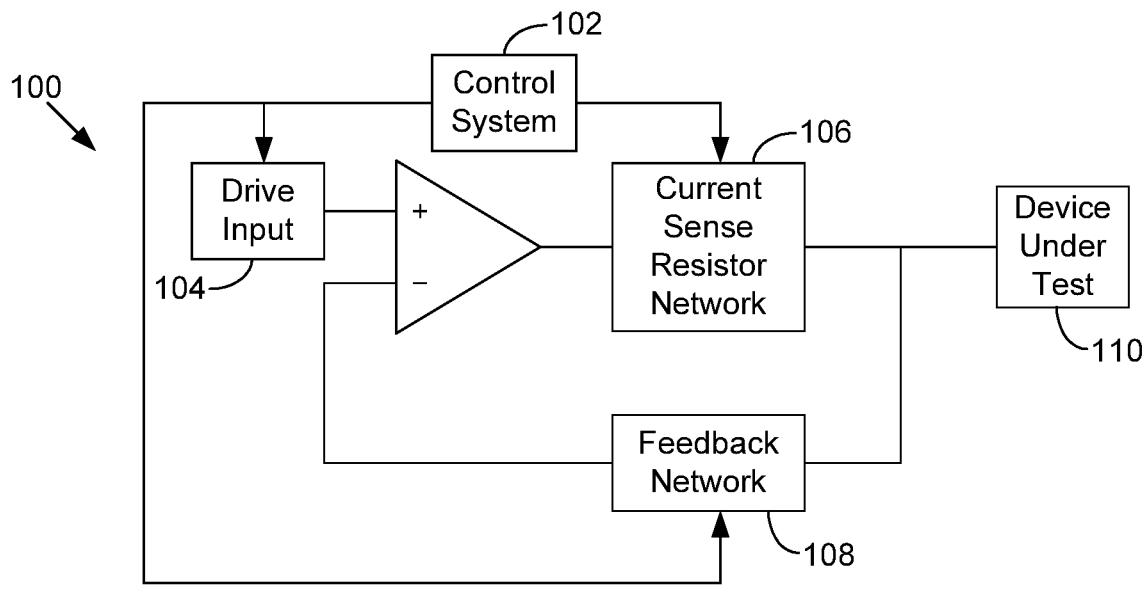
FIG. 1 illustrates an exemplary SMU with current sensing circuitry.

The present invention relates generally to electrical measurement equipment, and, in particular, to Source Measurement Units (SMUs) for use in measuring electrical current. The embodiments herein describe voltage limiting circuitry limiting the voltage developed across a current sensing circuit of an SMU. FIG. 1 is a simplified circuit diagram of a typical SMU 100, which includes a drive input 104 to drive the feedback loop; a current sense resistor network 106 for sensing the current flowing to or from the Device Under Test (DUT) 110; a feedback loop, including a feedback network 108, for sourcing voltage to the DUT 110; and a control system 102 for selecting the optimal arrangement of resistors in the current sense resistor network 106 as well as other functionality.

Figure 2:
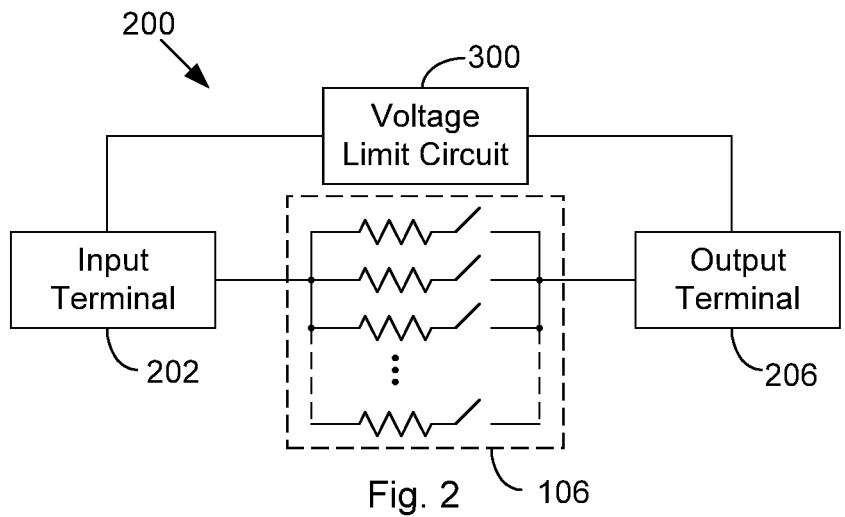
FIG. 2 illustrates a current sense resistor network coupled with a voltage limiting circuit in accordance with an embodiment.

The current sense resistor network 106 must detect current over a wide range of currents with typical resistor values ranging from 1 ohm to 1E9 ohms, allowing current measurement levels from at least 1E-12A to 1A. FIG. 2 is a diagram of an exemplary circuit 200, which includes a current sense resistor network 106 coupled with a voltage limit circuit 300 through an input terminal 202 and output terminal 206, in accordance with an embodiment. The current sense resistor network 106 will generally include a plurality of current sense resistors, switches (mechanical relay, solid-state relays, reed relays, and the like), and selection circuitry to optimally configure the current sense resistor network 106 for the current level to be measured.

The control system 102 for the SMU 100 generally has no prior knowledge of the current level for a specific set of conditions, and therefore the current sense resistor network configuration will typically remain static until the voltage developed across it, due to the DUT current flow, either falls below a predefined minimum threshold or rises above a predefined maximum threshold.

In the case that the predefined minimum threshold is reached, the current sense resistor network configuration will be changed so that higher value resistors are connected and an optimal voltage is achieved. In the case that the predefined maximum threshold is reached, the current sense resistor network configuration will be changed so that lower value resistors are connected and an optimal voltage is achieved. However, the difference in behavior between these two cases is significant and can cause undesirable voltage transients or glitches on the output of the SMU 100.

In the case that the current sense resistor network voltage falls below the predefined minimum threshold voltage, the output voltage of the SMU 100 remains at the target level and the control system 102 can simply change the resistor configuration without a transient occurring. However, for the case in which the current sense resistor network voltage exceeds the predefined maximum threshold voltage, the output voltage of the SMU 100 may fall below the target voltage and become overloaded.

The overload situation occurs due to the limitation of SMU source circuitry, which is typically limited by the power supplies of the system. For example, a typical operational amplifier (opamp) used in an SMU will use +/−15V power supplies referenced to a driven reference signal, and the opamp's output is limited to remaining within these supply levels (i.e., the opamp's output voltage must be in a range greater than −15V and less than +15V around the driven reference signal). If, for example, a 1 Gohm resistor is connected, and the current draw of the DUT 110 changes such that 100 nA of current is required (and correspondingly a current sense resistor network burden voltage of 100V is required), the sourcing opamp's output will go to its power supply limit (termed railing) to try and achieve the target voltage. Since the target voltage cannot be achieved, the SMU output voltage will fall to a lower level and the SMU 100 will be in an undesirable overloaded state.

Furthermore, in the overloaded state, it is also undesirable to switch the current sense resistor network resistors to lower values because this change will typically cause a transient voltage signal on an SMU's output due to the large voltage developed across the current sense resistor network 106 abruptly changing (i.e., the feedback loop cannot respond quickly or cleanly enough), and the sourcing opamp coming out of its railing condition. The resultant transient voltage signal is undesirable because it may damage the DUT 110. For these reasons a circuit for limiting the voltage developed across the current sense resistor network 106 is desirable.

Figure 3:
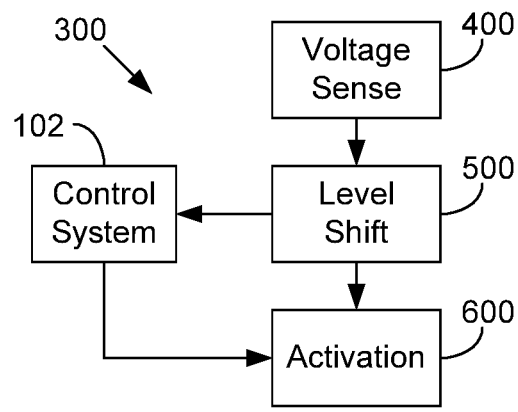
FIG. 3 illustrates a block diagram representation of a voltage limiting circuit in accordance with an embodiment.

In accordance with an embodiment, a voltage limiting circuit that resolves the above described problems is presented. The diagram in FIG. 3 shows a simplified block diagram of an embodiment of the voltage limiting circuit 300. The block diagram includes three sub-circuits of the voltage limiting circuit 300, which perform various required functionality. The voltage sense circuit 400 provides the functionality of detection of voltage developed across the current sense resistor network 106 and provides a signal to the activation circuit 600 in accordance with a predefined output voltage being exceeded. The activation circuit provides an activation signal to the voltage limiting circuit 300 in response to receiving the signal from the voltage sense circuit 400 that the a predefined output voltage is exceeded. The level shifting circuit 500 provides the functionality of shifting the voltage levels of signals to levels that are required for proper operation.

Additionally, the control system 102 is not a sub-circuit of the voltage limiting circuit, but in some embodiments, interfaces with the voltage limiting circuit 300 to control its operation as well as other portions of the SMU 100. In the next sections, the description of the three voltage limiting sub-circuits is expanded upon as well as various embodiments and additional features each may have.

Figure 4:
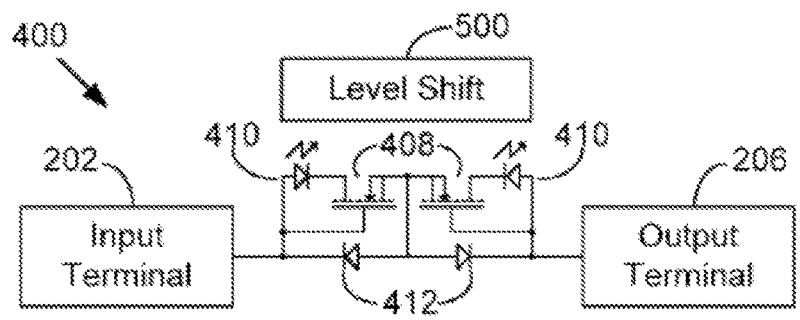
FIG. 4 illustrates a voltage sense circuit coupled with a level shifting circuit in accordance with an embodiment.

An embodiment of the voltage sense circuit 400 is shown in FIG. 4. In this embodiment, the voltage sense circuit includes a pair of "programmable threshold" field effect transistors 408 configured such that voltage developed across the current sense resistor network 106, through the input terminal 202 and output terminal 206, provides a bias to the gate and source nodes of the pair of transistors 408. In this configuration, the pair of transistors 408 will conduct an insignificant amount of current with a gate to source bias below the predefined voltage threshold. In the case that the voltage threshold is exceeded (i.e., the current sense resistor network 106 is becoming overloaded), the pair of transistors 408 activate and begin to conduct current through their drain-source nodes.

Each of the pair of transistors 408 is configured to conduct current in a different direction (i.e., one is configured for current flow to the DUT 110 and the other from the DUT 110, for proper SMU operation in both sinking and sourcing current). Additionally, in some embodiments, a pair of diodes 412 is connected to the transistor pair 408 in opposite polarity configuration so that a low voltage drop path is present in the current direction that each of the transistors 408 is not configured to conduct. Furthermore, in some embodiments, a pair of light emitting diodes (LEDs) 410 is connected in series with the pair of transistors 408 as shown in FIG. 4 to provide a signal to the level shift circuit 500 in the case that the predefined voltage threshold is exceeded.

Figure 5:
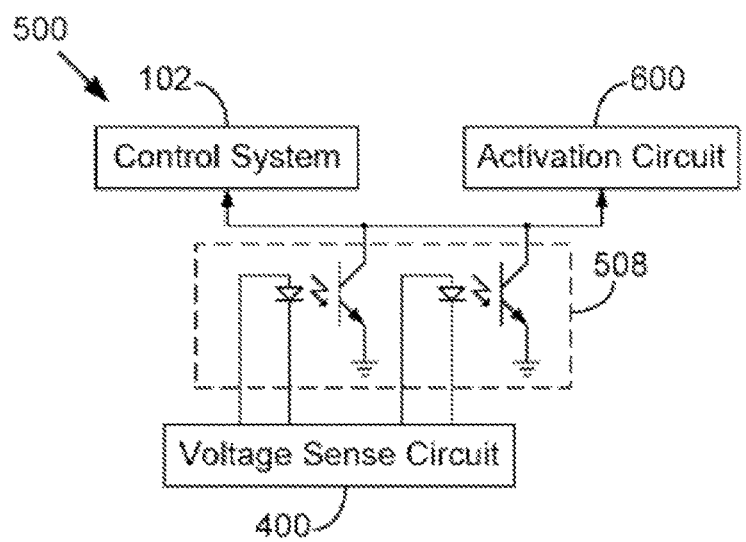
FIG. 5 illustrates a level shifting circuit coupled with a voltage sense circuit, activation circuit, and control system in accordance with an embodiment.

As shown in FIG. 5, in an example embodiment, the level shift circuit 500 includes optocouplers 508 that provide level shifting of a signal received from the voltage sense circuit 400 to the activation circuit 600. Typically, the LEDs 410 of the voltage sense circuit will be included in the optocoupler as an integrated circuit, which has the capability of shifting a signal at one voltage level over an isolated barrier to a create a related signal at another voltage level. In the embodiment shown in FIG. 5, an optical interface provides the electrical translation between the different voltage levels, but the level shift could use a different interface method including inductive, capacitive, or any other method of coupling, which isolates the signals. Furthermore, the level shifting integrated circuit may include a single level shifting circuit or multiple within the same package.

A typical SMU 100 output voltage ranges from 0V to +/−200V (ground referenced) and the current sense resistor network 106 will have a common mode voltage near the output voltage (i.e., if the output voltage is 150V, the voltages in the current sense resistor network 106 will typically be within a 5V window of 150V, or from 145V to 155V). However, much of the remainder of the SMU circuitry (e.g., logic and mixed-signal circuitry) will operate at much lower ground referenced voltage levels (typically 3.3V or 5V). In order to interface the voltage sense circuitry with the activation circuit, the optocouplers 508 are used to level shift the signal from the voltage sense circuit (typically ranging from −200V to +200V) to the activation circuit (typically ranging from +3.3V to +5V). In some embodiments, this level shifted signal can also be used as an input signal to the control system 102 to indicate that the voltage across the current sense resistor network 106 has reached the predetermined threshold voltage and various steps can be performed to avoid an overload condition. In some embodiments, the level shifted signal is used as a binary signal (i.e., an on or off state). In some embodiments, the level shifted signal is used as an analog signal (i.e., no discrete levels but a range of voltage that provides more detailed information about the operation state).

Figure 6:
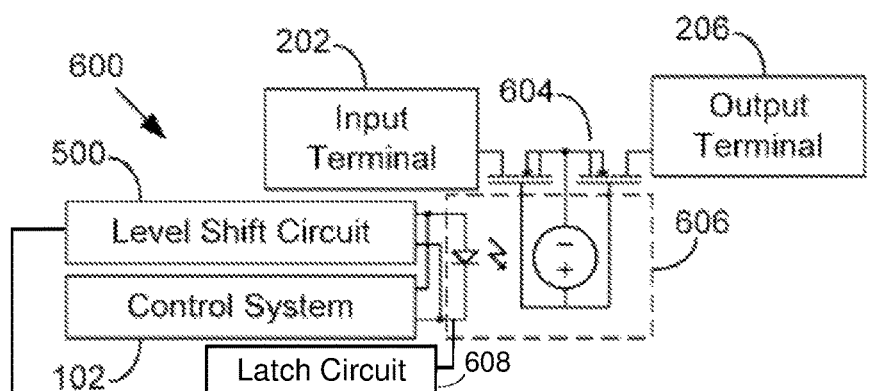
FIG. 6 illustrates an activation circuit coupled with a voltage sense circuit and control system in accordance with an embodiment.

In some embodiments, the activation circuitry 600 is as depicted in FIG. 6. In this configuration, the activation circuit receives the level shifted signal from the voltage sense circuit 400 through the level shifting circuit 500 and provides the functionality of activating the voltage limiting circuit. In some embodiments, the activation circuit includes a PhotoVoltaic Isolator (PVI) 606 and activation of the voltage limiting circuitry is performed through biasing of the PVI 606, which receives an activation signal from the voltage sense circuit through the level shifting circuit.

In some embodiments, the activation signal is applied directly from the output of the level shifting circuit 500. In other embodiments, the activation signal is applied to the PVI 606 through some modification of the level shifted signal. In some embodiments, the level shifted signal is applied to a latch such that the activation signal remains activated once the predetermined threshold voltage is reached (i.e., the latch circuit provides a constant bias to the PVI), even if the condition exceeding the predetermined threshold voltage is removed. In such an embodiment, the activation circuit 600 is deactivated through a separate signal provided by the control system 102 in accordance with determination that the overload condition is removed.

In other embodiments, the activation signal is latched only at or above a predetermined current level through the current sense resistor network 106, different from the predetermined maximum threshold voltage, but remains a non-latched signal for lower currents. For example, in one embodiment, an overload condition resulting from current greater than or equal to 10 mA may cause the activation signal to remain latched and require a separate deactivation signal, while currents less than 10 mA may cause the activation signal to activate and deactivate without a separate deactivation signal.

In some embodiments, the latching activation signal may cause the voltage limiting circuit to lower the current sense resistor network voltage drop to an insignificant level (e.g., less than 10 mV), while the non-latching activation signal may cause the voltage limiting circuit to maintain the current sense resistor network voltage at a predefined level. In this way, the circuit can be configured such that the voltage limiting circuit does not dissipate more than a predetermined amount of power.

In some embodiments as also shown in FIG. 6, the PVI 606 of the activation circuit 600 provides a bias signal to the gate-source nodes of a pair of power field effect transistors 604 connected to the input terminal 202 and output terminal 206 connected to the current sense resistor network 106. The power transistors 604 provide the functionality of limiting the voltage developed across the current sense resistor network 106 by shunting current through their drain-source nodes in accordance with an overvoltage condition occurring. In some embodiments, the power field effect transistors 604 are also used for other purposes. For example, in an embodiment, the power field effect transistors 604 are biased by the PVI 606, which receives a signal from a Digital to Analog Converter (DAC) to activate conduction of the power transistors or not. For example, the control system 102 may use this functionality to enable conduction of the power transistors in a controlled manner prior to switching resistors in the current sense resistor network 106, so that a glitch does not occur on the output when the resistors are switched. This type of circuit is often termed a deglitcher. Sharing the functionality of the power transistors for both the voltage limiting circuit and current sense resistor network switching deglitcher is important for reducing the space, cost, leakage, and capacitance that would otherwise be required or present if each circuit used its own pair of power transistors.

Figure 7:
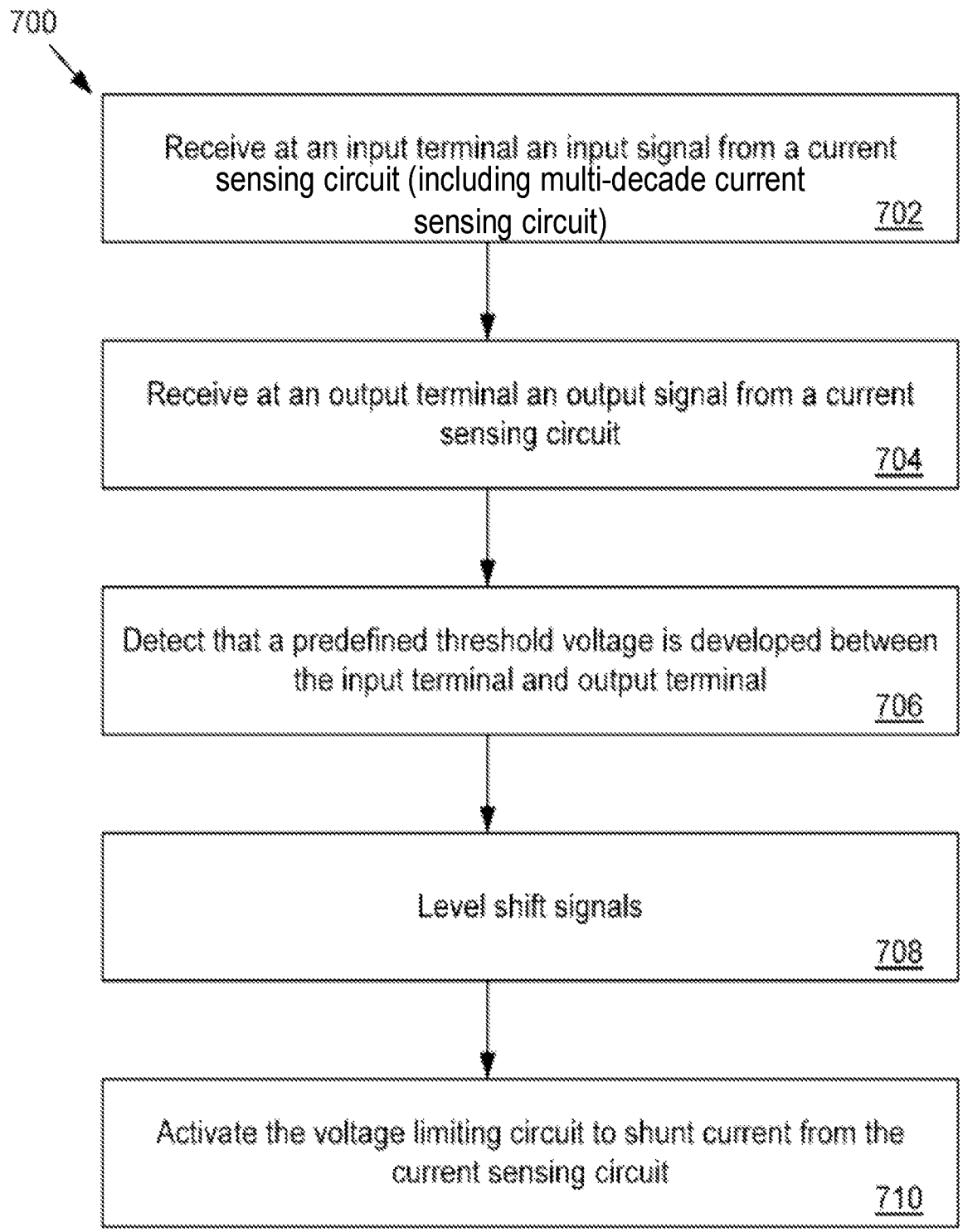
FIG. 7 is a flow chart of a method of limiting voltage developed across a current sensing circuit using a voltage limiting circuit.

FIG. 7 is a flow chart of a method 700 of limiting voltage developed across a current sensing circuit using a voltage limiting circuit. The method begins with an input signal received 702 from a current sensing circuit, at an input terminal of the voltage limiting circuit. In step 704, an output signal is received from a current sensing circuit, at an output terminal of the voltage limiting circuit. In step 706, a voltage sense circuit of the voltage limiting circuit detects that a predefined threshold voltage is developed between the input terminal and output terminal. In step 708, a level shifting circuit of the voltage limiting circuit level shifts a signal from the voltage sense circuit indicating a voltage overload condition exists. The level shifted signal is received by an activation circuit of the voltage limiting circuit, and in step 710, the activation circuit activates the voltage limiting circuit to shunt current from the current sensing circuit.

While only a few embodiments of the invention have been described in detail, it should be understood that many variations are possible based on the disclosure herein. Although features and elements are described above in particular combinations, each feature or element can be used alone without the other features and elements or in various combinations with or without other features and elements. In view of all of the foregoing, it should be apparent that the present embodiments are illustrative and not restrictive and the invention is not limited to the details given herein, but may be modified within the scope and equivalents of the appended claims.

What is claimed is:

1. A voltage limiting circuit for limiting a voltage developed across a current sensing circuit, the voltage limiting circuit comprising:
    an input terminal configured to receive an input signal from the current sensing circuit;
    an output terminal configured to receive an output signal from the current sensing circuit;
    a voltage sense circuit configured to detect that a predefined threshold voltage is developed between the input terminal and output terminal;
    a level shifting circuit configured to level shift signals; and
    an activation circuit configured to activate the voltage limiting circuit.

2. The voltage limiting circuit of claim 1, wherein the level shifting circuit comprises a first and second optoisolator configured to shift voltage levels of signals.

3. The voltage limiting circuit of claim 1, wherein the input terminal and output terminal are connected in parallel to a resistor network.

4. The voltage limiting circuit of claim 3, wherein the resistor network is configured to provide current sense elements for a multi-decade current sensing circuit, wherein the resistor network is capable of detecting current over a range of currents with resistor values ranging from about 1 ohm to about 1E9 ohms.

5. The voltage limiting circuit of claim 3, wherein the voltage limiting circuit limits the voltage generated across the resistor network in an overload condition.

6. The voltage limiting circuit of claim 1, wherein the voltage sense circuit comprises one or more programmable threshold field effect transistors configured to conduct current at a predetermined threshold voltage.

7. The voltage limiting circuit of claim 1, further comprising a latch circuit configured to latch a state of the voltage limiting circuit.

8. The voltage limiting circuit of claim 7, wherein the latch circuit latches in accordance with a current through the voltage limiting circuit exceeding a predetermined threshold.

9. The voltage limiting circuit of claim 1, wherein the activation circuit comprises first and second shunting transistors.

10. The voltage limiting circuit of claim 9, wherein the first and second shunting transistors are also biased by a photovoltaic isolator of the activation circuit to enable conduction of the transistors in a controlled manner.

11. A method of limiting voltage developed across a current sensing circuit using a voltage limiting circuit, the method comprising:
    receiving at an input terminal an input signal from the current sensing circuit;

receiving at an output terminal an output signal from the current sensing circuit;

detecting by a voltage sense circuit that a predefined threshold voltage is developed between the input terminal and output terminal;

level shifting signals; and activating the voltage limiting circuit to shunt current from the current sensing circuit.

12. The method of claim 11, wherein the input terminal and output terminal are connected in parallel to a resistor network.

13. The method of claim 12, wherein the resistor network is configured to provide current sense elements for a multi-decade current sensing circuit, wherein the resistor network is capable of detecting current over a range of currents with resistor values ranging from about 1 ohm to about 1E9 ohms.

14. The method of claim 13, wherein the voltage limiting circuit limits the voltage generated across the resistor network in an overload condition.

15. The method of claim 11, wherein the voltage sense circuit comprises a programmable threshold field effect transistor configured to conduct current at a predetermined threshold voltage.

16. The method of claim 11, further comprising latching a latch circuit in accordance with a current through the voltage limiting circuit exceeding a predetermined threshold.

17. The method of claim 16, wherein latching the latch circuit provides a constant bias to a photovoltaic isolator.

\* \* \* \* \*